(12) United States Patent
Lee

(10) Patent No.: US 10,522,577 B2
(45) Date of Patent: Dec. 31, 2019

(54) IMAGE SENSOR

(71) Applicant: SK hynix Inc., Gyeonggi-do (KR)

(72) Inventor: Cha-Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/716,586

(22) Filed: Sep. 27, 2017

(65) Prior Publication Data

US 2018/0269238 A1 Sep. 20, 2018

(30) Foreign Application Priority Data

Mar. 15, 2017 (KR) ........................ 10-2017-0032454

(51) Int. Cl.
*H01L 27/146* (2006.01)
*H01L 27/30* (2006.01)

(52) U.S. Cl.
CPC .. *H01L 27/14601* (2013.01); *H01L 27/14612* (2013.01); *H01L 27/14636* (2013.01); *H01L 27/14643* (2013.01); *H01L 27/307* (2013.01)

(58) Field of Classification Search
CPC ................... H01L 27/14601; H01L 27/14612
See application file for complete search history.

(56) References Cited

U.S. PATENT DOCUMENTS

2001/0002827 A1* 6/2001 Yamazaki .......... H04N 1/00867
345/82

* cited by examiner

*Primary Examiner* — Marc Anthony Armand
(74) *Attorney, Agent, or Firm* — IP & T Group LLP

(57) ABSTRACT

An image sensor may include: a pixel array having a plurality of pixels arranged in a matrix structure; and an image array including a plurality of image dots which are arranged in a matrix structure, and implemented by output signals of the respective pixels. The position of a first pixel in the pixel array may not correspond to the position of an image dot corresponding to the first pixel in the image array, and the position of a second pixel adjacent to the first pixel in the pixel array may correspond to the position of an image dot corresponding to the second pixel in the image array.

19 Claims, 4 Drawing Sheets

IMAGE SENSOR

CROSS-REFERENCE TO RELATED APPLICATIONS

This application claims priority under 35 U.S.C. § 119 to Korean Patent Application No. 10-2017-0032454 filed on Mar. 15, 2017, the disclosure of which is herein incorporated by reference in its entirety.

TECHNICAL FIELD

Various embodiments relate to a semiconductor device fabrication technology, and more particularly, to an image sensor.

BACKGROUND

An image sensor refers to a device that converts an optical image into an electrical signal. Recently, due to developments in the computer and communication industries, the demand for an enhanced image sensor with a high integration density is increasing in various devices such as a digital camera, camcorder, Personal Communication System (PCS), game machine, security camera, medical microcamera and robot.

SUMMARY

Various embodiments are directed to an enhanced image sensor.

In an embodiment, an image sensor may include: a pixel array having a plurality of pixels arranged in a matrix structure; and an image array including a plurality of image dots which are arranged in a matrix structure, and implemented by output signals of the respective pixels. A position of a first pixel in the pixel array may not correspond to a position of an image dot corresponding to the first pixel in the image array, and a position of a second pixel adjacent to the first pixel in the pixel array may correspond to a position of an image dot corresponding to the second pixel in the image array.

The first and second pixels in the pixel array may be positioned at the same row, and the image dot corresponding to the first pixel in the image array may be positioned at a different row from the image dot corresponding to the second pixel. Image dots corresponding to pixels positioned at an Mth row and odd-numbered columns in the pixel array and image dots corresponding to pixels positioned at an (M−1)th or (M+1)th row and even-numbered columns in the pixel array may be positioned at the same row in the image array, where M is a natural number.

Each of the pixels may include: a light receiver comprising one or more photoelectric conversion elements; and a driver comprising a selection transistor, and positioned adjacent to the light receiver. The driver of the first pixel may be positioned at a first side of the light receiver of the first pixel, and the driver of the second pixel may be positioned at a second side of the light receiver of the second pixel. The drivers of the pixels positioned at the odd-numbered columns in the pixel array may be positioned at a second sides of the light receivers thereof, and the drivers of the pixels positioned at the even-numbered columns may be positioned at a first sides of the light receivers thereof. The drivers of the pixels positioned at the Mth row and odd-numbered columns in the pixel array may be aligned with the drivers of the pixels positioned at the (M−1)th or (M+1)th row and the even-numbered columns, respectively, in the row direction, where M is a natural number.

The pixels positioned at the odd-numbered columns among the plurality of pixels in the pixel array may have the same planar shape, the pixels positioned at the even-numbered columns may have the same planar shape, and the planar shape of the pixels positioned at the even-numbered columns may be symmetrical with the planar shape of the pixels positioned at the odd-numbered columns in the column direction.

In an embodiment, an image sensor may include: a pixel array having a plurality of pixels arranged in a matrix structure; and a plurality of selection lines extended in a row direction, and arranged at rows of the pixel array, respectively. Each of the pixels may include: a light receiver including one or more photoelectric conversion elements; and a driver including a selection transistor and positioned adjacent to the light receiver, and pixels arranged at odd-numbered columns in each row of the pixel array may be coupled to different selection lines from pixels arranged at even-numbered columns.

The drivers of the pixels positioned at the odd-numbered columns in the pixel array may be positioned at a second sides of the light receivers thereof, and the drivers of the pixels positioned at the even-numbered columns may be positioned at a first sides of the light receivers thereof. The drivers of the pixels positioned at the Mth row and odd-numbered columns in the pixel array may be aligned with the drivers of the pixels positioned at the (M−1)th or (M+1)th row and the even-numbered columns, respectively, in the row direction, where M is a natural number. The plurality of selection lines may be coupled to the gates of the selection transistors of the respective pixels.

The plurality of selection lines may be coupled to the plurality of pixels in a zigzag shape in the row direction. Each of the selection lines may have a straight line shape extending in the row direction. The drivers of the pixels positioned at an Mth row and the odd-numbered columns in the pixel array and the drivers of the pixels positioned at an (M−1)th or (M+1)th row and the even-numbered columns may be coupled to the same selection line, where M is a natural number.

The pixels positioned at the odd-numbered columns among the plurality of pixels in the pixel array may have the same planar shape, the pixels positioned at the even-numbered columns may have the same planar shape, and the planar shape of the pixels positioned at the even-numbered columns may be symmetrical with the planar shape of the pixels positioned at the odd-numbered columns in the column direction.

The image sensor may further include an image array including a plurality of image dots which are arranged in a matrix structure, and implemented by output signals of the respective pixels. A position of a first pixel in the pixel array may not correspond to a position of an image dot corresponding to the first pixel in the image array, and a position of a second pixel adjacent to the first pixel in the pixel array may correspond to a position of an image dot corresponding to the second pixel in the image array. The first and second pixels in the pixel array may be positioned at the same row, and the image dot corresponding to the first pixel in the image array may be positioned at a different row from the image dot corresponding to the second pixel. Image dots corresponding to pixels positioned at an Mth row and odd-numbered columns in the pixel array and image dots corresponding to pixels positioned at an (M−1)th or (M+1)th row and even-numbered columns in the pixel array may be positioned at the same row in the image array, where M is a natural number.

DETAILED DESCRIPTION

Figure 1:
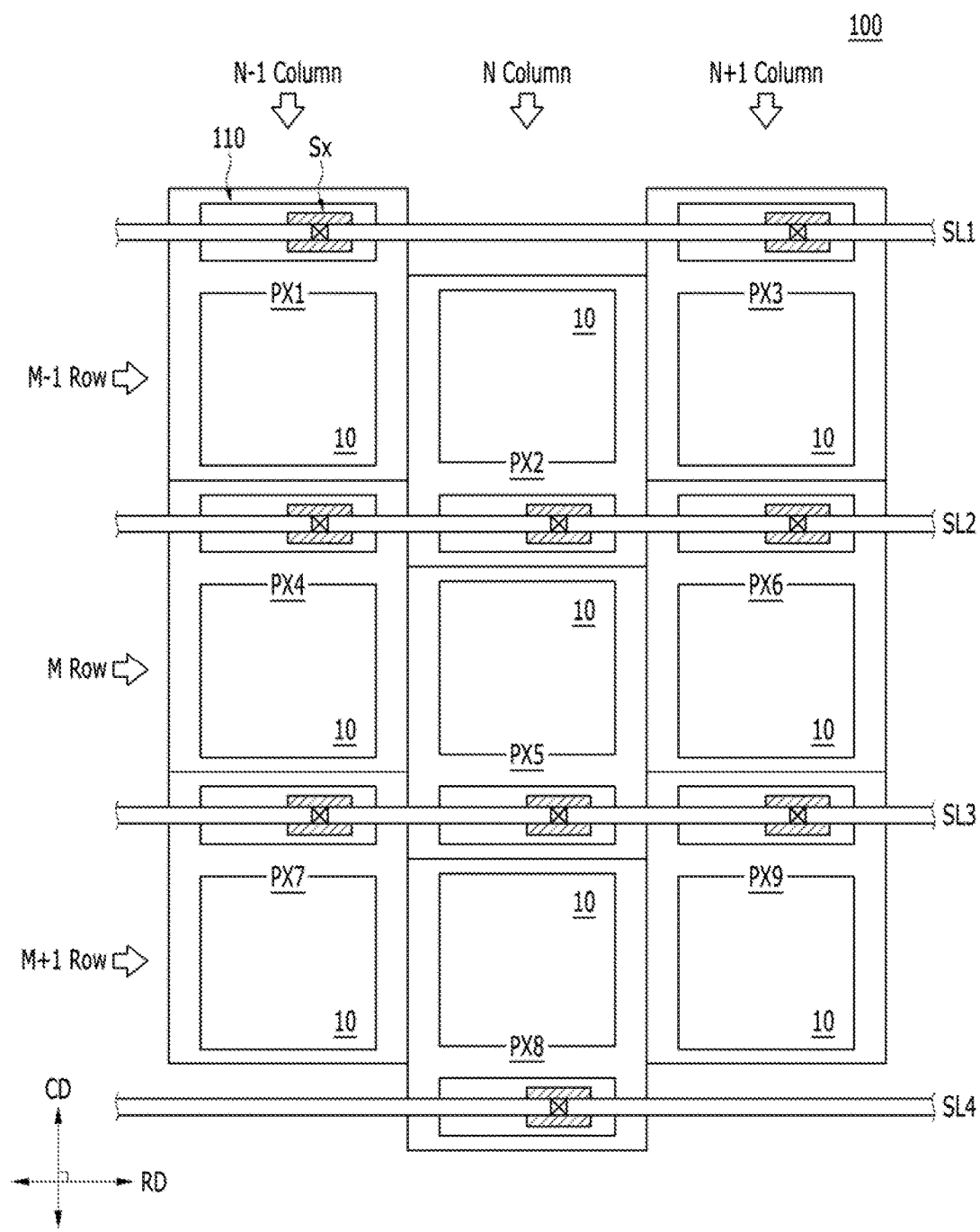
FIG. 1 is a diagram illustrating a part of a pixel array of an image sensor in accordance with an embodiment.

Various embodiments will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure for example, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure in which one or more other intermediate layers may exist between the first layer and the second layer or the substrate.

Various embodiments provide an enhanced image sensor. More specifically, the various embodiments provide an image sensor capable of preventing a characteristic degradation caused by fixed pattern noise (FPN). For this configuration, the image sensor in accordance with the present embodiment may include a pixel array having a plurality of pixels arranged in a matrix structure and an image array in which a plurality of image dots are arranged in a matrix structure so as to correspond to the respective pixels, and implemented by output signals of the respective pixels. The position of any one pixel in the pixel array may not correspond to the position of an image dot corresponding to the pixel in the image array. Furthermore, the position of a pixel adjacent to any one pixel in the pixel array may correspond to the position of an image dot corresponding to the adjacent pixel in the image array. This configuration can prevent an expression of FPN in the image array which is implemented by output signals, even though the FPN physically occurred in the pixel array. That is, the image sensor can display an image from which FPN is removed.

Hereafter, an image sensor in accordance with an embodiment will be described with reference to the accompanying drawings.

Figure 2:
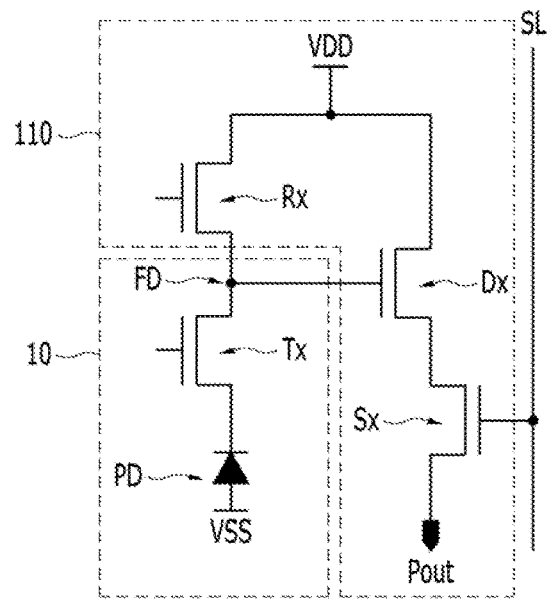
FIG. 2 is an equivalent circuit diagram of a pixel in an image sensor in accordance with an embodiment.
Figure 3:
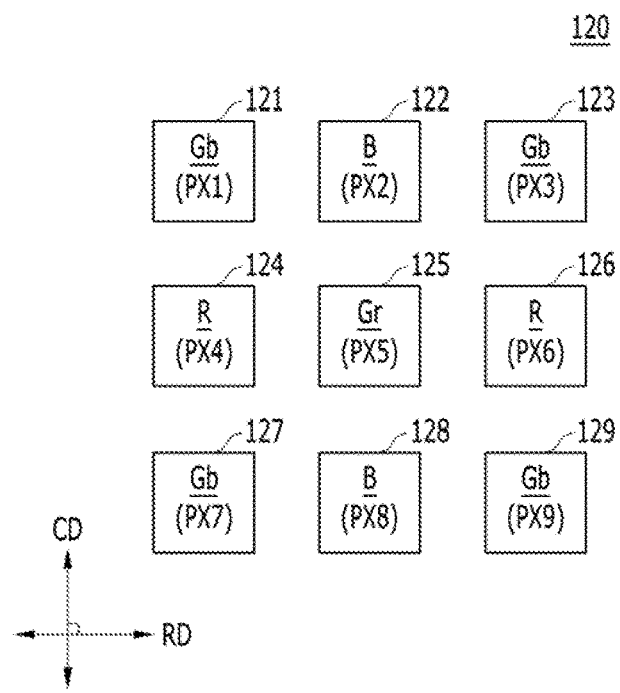
FIG. 3 is a diagram illustrating a color filter array corresponding to a part of a pixel array of an image sensor in accordance with an embodiment.
Figure 4:
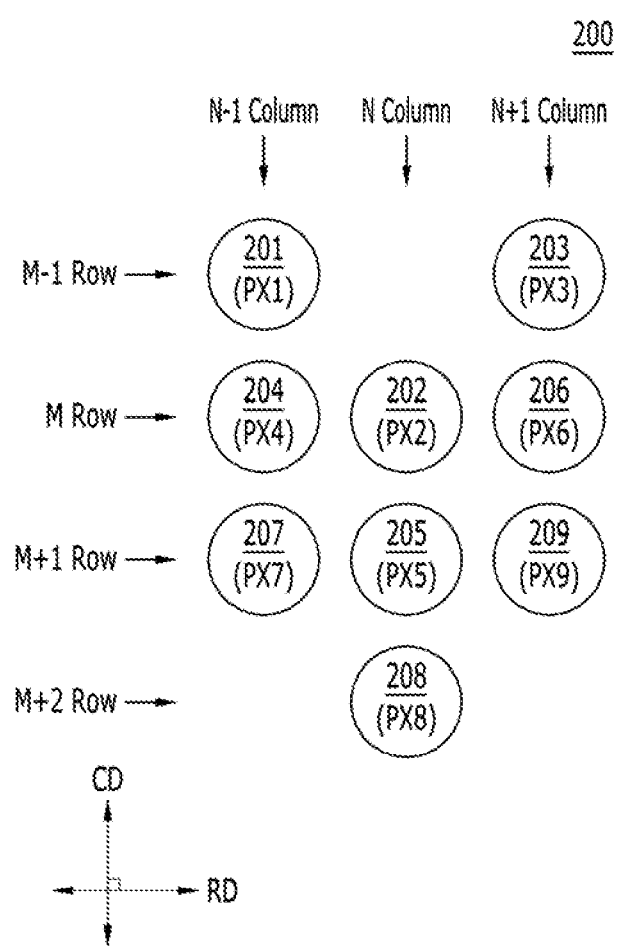
FIG. 4 is a diagram illustrating an image array corresponding to a part of a pixel array of an image sensor in accordance with an embodiment.

FIG. 1 is a diagram illustrating a part of a pixel array of an image sensor in accordance with an embodiment. FIG. 2 is an equivalent circuit diagram of a pixel in an image sensor in accordance with an embodiment. FIG. 3 is a diagram illustrating a color filter array corresponding to a part of a pixel array of an image sensor in accordance with an embodiment. FIG. 4 is a diagram illustrating an image array corresponding to a part of a pixel array of an image sensor in accordance with an embodiment.

Referring to FIGS. 1 to 4, the image sensor in accordance with the embodiment may include a pixel array 100 and a plurality of selection lines SL. The pixel array 100 may include a plurality of pixels PX1 to PX9 arranged in an M×N matrix structure, where M and N are natural numbers. The plurality of selection lines SL may be extended in a row direction RD, coupled to the plurality of pixels PX1 to PX9, and arranged at the respective rows of the pixel array 100. The selection lines SL may have a straight line shape extending in the row direction RD. For example, the pixel array 100 may include nine pixels or first to ninth pixels PX1 to PX9 arranged in a 3×3 matrix structure. The selection lines SL may include first to fourth selection lines SL1 to SL4 which are formed in a straight line shape extending in the row direction RD, separate from each other in a column direction CD, and arranged at the respective rows of the pixel array 100.

Each of the pixels PX1 to PX9 may include a light receiver 10 for generating a photo charge in response to incident light and a driver 110 for generating and outputting an output signal Pout corresponding to the photo charge generated by the light receiver 10. The light receiver 10 and the driver 110 may be electrically coupled to each other through a conductive line (not illustrated). In the pixel array 100, pixels positioned at the odd-numbered columns among the plurality of pixels PX1 to PX9 may have the same planar shape, and pixels positioned at the even-numbered columns among the plurality of pixels PX1 to PX9 may have the same planar shape. At this time, the planar shape of the pixels positioned at the even-numbered columns may be symmetrical with the planar shape of the pixels positioned at the odd-numbered columns, in the column direction CD. That is, the planar shape of the pixels positioned at the even-numbered columns may be symmetrical with the planar shape of the pixels positioned at the odd-numbered columns, in the top-to-bottom direction. This is in order to prevent a characteristic degradation caused by FPN, for example, a degradation in image quality.

The light receiver 10 may include a photoelectric conversion element or photo detector PD for generating a photo charge in response to incident light, and a transfer transistor Tx for transferring the photo charge generated by the photoelectric conversion element PD to a floating diffusion FD in response to a transfer signal. The photoelectric conversion element PD may include an organic or/and inorganic photodiode. For example, the photoelectric conversion element PD may be implemented with any one of organic and inorganic photodiodes, or have a stacked structure of organic and inorganic photodiodes. For reference, FIG. 1 illustrates that the light receiver 10 includes one photoelectric conversion element PD and one transfer transistor Tx, but the present embodiment is not limited thereto. In a modification, the light receiver 10 may have a $2^n$-shared pixel structure including a plurality of photoelectric conversion elements and transfer transistors, where n is a natural number.

In the pixel array 100, the light receivers 10 of the respective pixels PX1 to PX9 may be aligned in the row direction RD and the column direction CD. For example, the light receivers 10 of the first to third pixels PX1 to PX3 may be aligned in the row direction RD. The light receivers 10 of the first, fourth and seventh PX1, PX4 and PX7 may be aligned in the column direction CD.

The driver 110 may include a selection transistor Sx. The selection transistor Sx may output an output signal Pout generated by the driver 110 to a column line (not illustrated) in response to a select signal. The select signal may be applied to the selection transistor Sx through a selection line SL. The selection transistor Sx may couple a driver transistor Dx and the column line (not illustrated), and the selection line SL may be coupled to the gate of the selection transistor Sx. Therefore, the selection line SL may be referred to as 'select gate control line'.

The driver 110 may further include a reset transistor Rx and the driver transistor Dx. The reset transistor Rx for coupling the floating diffusion FD and a supply voltage terminal VDD may serve to reset the floating diffusion FD in response to a reset signal. The driver transistor Dx may have a gate coupled to the floating diffusion FD, and couple the supply voltage terminal VDD and the selection transistor Sx. The driver transistor Dx may serve to generate the output signal Pout corresponding to the photo charge generated by the photoelectric conversion element PD.

The driver 110 in each of the pixels PX1 to PX9 may be positioned at one side or the other side of the photoelectric conversion element PD in the column direction CD. For example, in each of the pixels positioned in an Nth column or even-numbered column in the pixel array 100, the driver 110 may be positioned at the bottom of the light receiver 10. Moreover, in each of the pixels positioned in an (N−1)th or (N+1)th column or odd-numbered column of the pixel array 100, the driver 110 may be positioned at the top of the light receiver 10. Therefore, the drivers 110 of the respective pixels PX1 to PX9 may be arranged in a zigzag shape on a row basis. For example, the drivers 110 of the pixels in each of (M−1)th, Mth and (M+1)th rows may be arranged in a zigzag shape.

Although the drivers 110 of the pixels PX1 to PX9 are arranged in a zigzag shape on a row basis, the drivers 110 of the respective pixels PX1 to PX9 in the pixel array 100 may be aligned in the row direction RD. At this time, the drivers 110 of the pixels positioned at odd-numbered columns or even-numbered columns among the pixels positioned at any one row and the drivers 110 of the pixels positioned at even-numbered columns or odd-numbered columns among the pixels positioned at a row adjacent to the corresponding row may be aligned in the row direction RD. The selection lines SL may be coupled to the drivers 110 of the respective pixels PX1 to PX9, which are aligned in the row direction RD. For example, the drivers 110 of the fourth pixel PX4 and the sixth pixel PX6, which are positioned at odd-numbered columns, for example, the (N−1)th column and the (N+1)th column among the pixels positioned at the Mth row, may be aligned with the driver 110 of the second pixel PX2 in the row direction RD, which is positioned at an even-numbered column, for example, the Nth column among the pixels positioned at the (M−1)th row adjacent to the Mth row. That is, the drivers 110 of the fourth pixels PX4, the second pixel PX2 and the sixth pixel PX6 may be coupled to the second selection line SL2 positioned at the Mth row. As the drivers 110 of the pixels PX1 to PX9 In the pixel array 100 are aligned in the row direction RD and the column direction CD, the selection lines SL coupled to the selection transistors Sx of the drivers 110 of the respective pixels PX1 to PX9 may have a straight shape. Such a configuration can prevent a characteristic degradation caused by FPN, for example, a degradation in image quality, while reducing the difficulty level in design and fabrication process for the conductive lines including the selection lines SL.

The image sensor in accordance with the present embodiment may include the color filter array 120 and the image array 200 which correspond to the pixel array 100.

Referring to FIG. 3, the color filter array 120 may include a plurality of color filters 121 to 129 corresponding to the respective pixels PX1 to PX9. For example, the color filter array 120 may include first to ninth color filters 121 and 129 corresponding to the first to ninth pixels PX1 to PX9, respectively. Each of the color filters 121 and 129 may be implemented with a single filter including any one selected from a group consisting of a red filter, a green filter, a blue filter, a cyan filter, a yellow filter, a magenta filter, a white filter, a black filter, an IR cutoff filter, an IR pass filter and a band pass filter for passing a specific wavelength band, or a multi-filter including two or more filters thereof. For example, the color filter array 120 may include a Bayer pattern in which RGr/GbB are repeated. At this time, the second and eighth color filters 122 and 128 may be set to blue filters B. The first, third, seventh and ninth color filters 121, 123, 127 and 129, which are adjacent to the blue filters, may be set to first green filters Gb. The fourth and sixth color filters 124 and 126 may be set to red filters R, and the fifth color filter 125 adjacent to the red filters R may be set to a second green filter Gr.

Referring to FIG. 4, the image array 200 may include a plurality of image dots 201 to 209 which are arranged in an M×N matrix structure so as to correspond to the respective pixels PX1 to PX9, and implemented by output signals Pout of the respective pixels PX1 to PX9, where M and N are natural numbers. For example, the image array 200 may include first to ninth image dots 201 and 209 corresponding to the first to ninth pixels PX1 to PX9, respectively. The second and eighth image dots 202 and 208 may be implemented by the output signals Pout of the second and eighth pixels PX2 and PX8 which sensed incident light color-separated by the blue filters B. The second and eighth image dots 202 and 208 can display the blue color. The fourth and sixth image dots 204 and 206 may be implemented by the output signals Pout of the fourth and sixth pixels PX4 and PX6 which sensed incident light color-separated by the red filters R. The fourth and sixth image dots 204 and 206 can display the red color. The first, third, fifth, seventh and ninth image dots 201, 203, 205, 207 and 209 may be implemented by the output signals Pout of the first, third, fifth, seventh and ninth pixels PX1, PX3, PX5, PX7 and PX9 which sensed incident light color-separated by the green filters Gb and Gr. The first, third, fifth, seventh and ninth image dots 201, 203, 205, 207 and 209 can display the green color.

In the image sensor in accordance with the present embodiment, the position of any one pixel in the pixel array 100 in FIG. 1 may not correspond to the position of an image dot corresponding to the pixel in the image array 200 in FIG. 4, in order to prevent a characteristic degradation caused by FPN. Furthermore, the position of a pixel adjacent to any one pixel in the pixel array 100 may correspond to the position of an image dot corresponding to the adjacent pixel in the image array 200. For example, the first and second pixels PX1 and PX2 in the pixel array 100 may be positioned at the same row, and the first image dot 201 corresponding to the first pixel PX1 and the second image dot 202 corresponding to the second pixel PX2 in the image array 200 may be positioned at different rows from each other.

More specifically, the image dots corresponding to the pixels positioned at the Mth row and odd-numbered columns in the pixel array 100 and the image dots corresponding to the pixels positioned at the (M−1)th or (M+1)th row and even-numbered columns in the pixel array 100 may be positioned at the same row in the image array 200. For example, when the second selection line SL2 is enabled, the second pixel PX2 can be selected among the pixels positioned at the (M−1)th row, and the fourth and sixth pixels PX4 and PX6 can be selected among the pixels positioned at the Mth row. Thus, the output signals Pout of the fourth, second and sixth pixels PX4, PX2 and PX6 may be outputted through the column lines (not illustrated) arranged at the respective columns. In the pixel array 100, the fourth and sixth pixels PX4 and PX6 may be positioned at the intersections between the Mth row and the (N−1)th column and between the Mth row and the (N+1)th column. In the image array 200, the fourth and sixth image dots 204 and 206 corresponding to the fourth and sixth pixels PX4 and PX6 may be positioned at the intersections between the Mth row and the (N−1)th column and between the Mth row and the (N+1)th column. That is, the positions of the fourth and sixth pixels PX4 and PX6 in the pixel array 100 may correspond to the positions of the fourth and sixth image dots 204 and 206 in the mage array 200. Moreover, the second pixel PX2 in the pixel array 100 may be positioned at the intersection between the (M−1)th row and the Nth column, but the second image dot 202 corresponding to the second pixel PX2 in the image array 200 may be positioned at the intersection between the Mth row and the Nth column. That is, the position of the second pixel PX2 in the pixel array 100 may not correspond to the position of the second image dot 202 in the image array 200.

As such, when any one selection line SL is enabled, the pixels outputted from the odd-numbered columns and the pixels outputted from the even-numbered columns may be positioned at different rows in the pixel array 100, but positioned at the same row in the image array 200. That is, since the image dots positioned at any one row in the image array 200 have a structure in which pixels arranged at the row and pixels adjacent to the row in the pixel array 100 are alternately arranged, the image sensor can prevent a characteristic degradation caused by FPN, for example, a degradation in image quality.

The image sensor in accordance with the present embodiment can prevent an expression of FPN in the image array 200 implemented by the output signals Pout, even though the FPN physically occurred in the pixel array 100. That is, the image sensor can display an image from which the FPN is removed.

Although not illustrated, the pixels positioned at the odd-numbered rows and odd-numbered columns among the plurality of pixels in the pixel array 100 may have the same planar shape, and the pixels positioned at the even-numbered rows and odd-numbered columns may have the same planar shape, in order to prevent an occurrence of FPN when the light receivers 10 have a shared pixel structure. At this time, the planar shape of the pixels positioned at the even-numbered rows and odd-numbered columns and the planar shape of the pixels positioned at the odd-numbered rows and odd-numbered columns may be symmetrical with each other, in the row direction RD. That is, the planar shape of the pixels positioned at the even-numbered rows and odd-numbered columns and the planar shape of the pixels positioned at the odd-numbered rows and odd-numbered columns may be symmetrical with each other, in the side-to-side direction.

Furthermore, the pixels positioned at the odd-numbered rows and even-numbered columns among the plurality of pixels may have the same planar shape. The planar shape of the pixels positioned at the odd-numbered rows and even-numbered columns may be symmetrical with the planar shape of the pixels positioned at the odd-numbered rows and odd-numbered columns, in the column direction CD. That is, the planar shape of the pixels positioned at the odd-numbered rows and even-numbered columns may be symmetrical with the planar shape of the pixels positioned at the odd-numbered rows and odd-numbered columns, in the top-to-bottom direction.

Furthermore, the pixels positioned at the even-numbered rows and even-numbered columns among the plurality of pixels may have the same planar shape. The planar shape of the pixels positioned at the even-numbered rows and even-numbered columns may be symmetrical with the planar shape of the pixels positioned at the even-numbered rows and odd-numbered columns, in the column direction CD. That is, the planar shape of the pixels positioned at the even-numbered rows and even-numbered columns may be symmetrical with the planar shape of the pixels positioned at the even-numbered rows and odd-numbered columns, in the top-to-bottom direction.

The image sensor in accordance with the above-described embodiments may be used in various electronic devices or systems. Hereafter, a case in which the image sensor in accordance with the embodiments is applied to a camera will be described with reference to FIG. 5.

Figure 5:
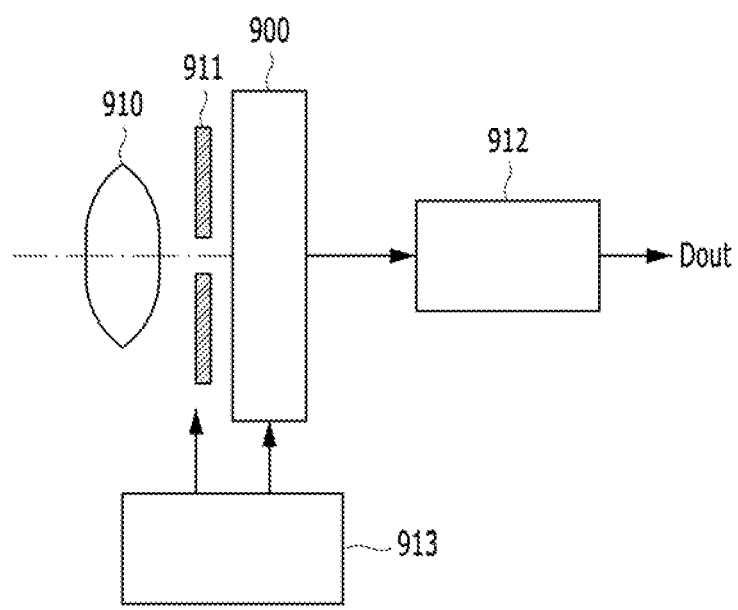
FIG. 5 is a diagram schematically illustrating an example of an electronic device including an image sensor in accordance with an embodiment.

FIG. 5 is a diagram schematically illustrating an example of an electronic device including an image sensor in accordance with an embodiment.

Referring to FIG. 5, the electronic device including the image sensor in accordance with the embodiments may be a camera capable of taking a still Image or a moving picture. The electronic device may include an image sensor 900, an optical system or optical lens 910, a shutter unit 911, a signal processing unit 912 and a driving unit 913. The driving unit 913 may control and/or drive the image sensor 900, the shutter unit 911, and the signal processing unit 912.

The optical system 910 may guide image light or incident light from an object (not shown), to a pixel array (see the reference numeral 100 of FIG. 1) of the image sensor 900. The optical system 910 may be constructed by a plurality of optical lenses. The shutter unit 911 may control a light irradiation period and a light shielding period for the image sensor 900. The driving unit 913 may control the transmission operation of the image sensor 900 and the shutter operation of the shutter unit 911. The signal processing unit 912 may perform various kinds of signal processing for the signal outputted from the image sensor 900. An image signal Dout after signal processing by the signal processing unit 912 may be stored in a storage medium such as a memory or be outputted to a monitor or the like.

In accordance with the present embodiment, the image sensor can prevent a characteristic degradation caused by FPN, and lower the difficulty level in a design and fabrication process for conductive lines including selection lines.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a pixel array having a plurality of pixels arranged in a matrix structure; and
   an image array comprising a plurality of image dots which are arranged in a matrix structure, and implemented by output signals of the respective pixels,
   wherein a position of a first pixel in the pixel array corresponds to a position of an image dot corresponding to the first pixel in the image array, and
   a position of a second pixel adjacent to the first pixel in the pixel array does not correspond to a position of an image dot corresponding to the second pixel in the image array.

2. The image sensor of claim 1, wherein the first and second pixels in the pixel array are positioned at the same row, and the image dot corresponding to the first pixel in the image array is positioned at a different row from the image dot corresponding to the second pixel.

3. The image sensor of claim 1, wherein image dots corresponding to pixels positioned at an Mth row and odd-numbered columns in the pixel array and image dots corresponding to pixels positioned at an (M−1)th or (M+1)th row and even-numbered columns in the pixel array are positioned at the same row in the image array, where M is a natural number.

4. The image sensor of claim 1, wherein each of the pixels comprises:
   a light receiver comprising one or more photoelectric conversion elements; and
   a driver comprising a selection transistor, and positioned adjacent to the light receiver.

5. The image sensor of claim 4, wherein the driver of the first pixel is positioned at a first side of the light receiver of the first pixel, and the driver of the second pixel is positioned at a second side of the light receiver of the second pixel.

6. The image sensor of claim 4, wherein the drivers of the pixels positioned at the odd-numbered columns in the pixel array are positioned at a second sides of the light receivers thereof, and the drivers of the pixels positioned at the even-numbered columns are positioned at a first sides of the light receivers thereof.

7. The image sensor of claim 4, wherein the drivers of the pixels positioned at the Mth row and odd-numbered columns in the pixel array are aligned with the drivers of the pixels positioned at the (M−1)th or (M+1)th row and the even-numbered columns, respectively, in the row direction, where M is a natural number.

8. The image sensor of claim 1, wherein the pixels positioned at the odd-numbered columns among the plurality of pixels in the pixel array have the same planar shape, the pixels positioned at the even-numbered columns have the same planar shape, and the planar shape of the pixels positioned at the even-numbered columns is symmetrical with the planar shape of the pixels positioned at the odd-numbered columns in the column direction.

9. An image sensor comprising:
   a pixel array having a plurality of pixels arranged in a matrix structure; and
   a plurality of selection lines extended in a row direction, and arranged at rows of the pixel array, respectively,
   wherein each of the pixels comprises:
   a light receiver comprising one or more photoelectric conversion elements; and
   a driver comprising a selection transistor and positioned adjacent to the light receiver, and
   pixels arranged at odd-numbered columns in each row of the pixel array are coupled to different selection lines from pixels arranged at even-numbered columns.

10. The image sensor of claim 9, wherein the drivers of the pixels positioned at the odd-numbered columns in the pixel array are positioned at a second sides of the light receivers thereof, and the drivers of the pixels positioned at the even-numbered columns are positioned at a first sides of the light receivers thereof.

11. The image sensor of claim 9, wherein the drivers of the pixels positioned at the Mth row and odd-numbered columns in the pixel array are aligned with the drivers of the pixels positioned at the (M−1)th or (M+1)th row and the even-numbered columns, respectively, in the row direction, where M is a natural number.

12. The image sensor of claim 9, wherein the plurality of selection lines are coupled to the gates of the selection transistors of the respective pixels.

13. The image sensor of claim 9, wherein the plurality of selection lines are coupled to the plurality of pixels in a zigzag shape in the row direction.

14. The image sensor of claim 13, wherein each of the selection lines has a straight line shape extending in the row direction.

15. The image sensor of claim 13, wherein the drivers of the pixels positioned at an Mth row and the odd-numbered columns in the pixel array and the drivers of the pixels positioned at an (M−1)th or (M+1)th row and the even-numbered columns are coupled to the same selection line, where M is a natural number.

16. The image sensor of claim 9, wherein the pixels positioned at the odd-numbered columns among the plurality of pixels in the pixel array have the same planar shape, the pixels positioned at the even-numbered columns have the same planar shape, and the planar shape of the pixels positioned at the even-numbered columns is symmetrical with the planar shape of the pixels positioned at the odd-numbered columns in the column direction.

17. The image sensor of claim 9, further comprising an image array comprising a plurality of image dots which are arranged in a matrix structure, and implemented by output signals of the respective pixels,
   wherein a position of a first pixel in the pixel array corresponds to a position of an image dot corresponding to the first pixel in the image array, and
   a position of a second pixel adjacent to the first pixel in the pixel array does not correspond to a position of an image dot corresponding to the second pixel in the image array.

18. The image sensor of claim 17, wherein the first and second pixels in the pixel array are positioned at the same row, and the image dot corresponding to the first pixel in the image array is positioned at a different row from the image dot corresponding to the second pixel.

19. The image sensor of claim 17, wherein image dots corresponding to pixels positioned at an Mth row and odd-numbered columns in the pixel array and image dots corresponding to pixels positioned at an (M−1)th or (M+1)th row and even-numbered columns in the pixel array are positioned at the same row in the image array, where M is a natural number.

* * * * *